US009269591B2

(12) United States Patent
Kalnitsky et al.

(10) Patent No.: US 9,269,591 B2
(45) Date of Patent: Feb. 23, 2016

(54) HANDLE WAFER FOR HIGH RESISTIVITY TRAP-RICH SOI

(71) Applicant: Taiwan Semiconductor Manufacturing Co., Ltd., Hsin-Chu (TW)

(72) Inventors: Alex Kalnitsky, San Francisco, CA (US); Chung-Long Chang, Hsinchu (TW); Yung-Chih Tsai, Jhudong Township (TW); Tsung-Yu Yang, Zhubei (TW); Keng-Yu Chen, Tainan (TW); Yong-En Syu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/222,785

(22) Filed: Mar. 24, 2014

(65) Prior Publication Data
US 2015/0270143 A1  Sep. 24, 2015

(51) Int. Cl.
*H01L 21/322* (2006.01)
*H01L 27/12* (2006.01)
*H01L 29/34* (2006.01)

(52) U.S. Cl.
CPC ........ *H01L 21/3226* (2013.01); *H01L 27/1203* (2013.01); *H01L 29/34* (2013.01)

(58) Field of Classification Search
CPC ............... H01L 2924/0002; H01L 2924/00; H01L 23/5227; H01L 23/552; H01L 23/645; H01L 23/66
See application file for complete search history.

(56) References Cited

U.S. PATENT DOCUMENTS

| 8,076,750 | B1 * | 12/2011 | Kerr et al. ............... 257/528 |
| 8,466,036 | B2 | 6/2013 | Brindle et al. |
| 2002/0187619 | A1 * | 12/2002 | Kleinhenz ........ H01L 21/76259 438/471 |
| 2003/0051660 | A1 * | 3/2003 | Koya ............... C30B 15/203 117/84 |
| 2011/0250739 | A1 * | 10/2011 | Falster et al. ............ 438/488 |
| 2012/0161310 | A1 * | 6/2012 | Brindle et al. ............ 257/734 |
| 2013/0089968 | A1 * | 4/2013 | Usenko ................. 438/458 |
| 2015/0004778 | A1 * | 1/2015 | Botula et al. ............. 438/510 |

OTHER PUBLICATIONS

Wijaranakula, et al. "Influence of the preepitaxial annealing and polycrystalline silicon deposition processes on oxygen precipitation and internal gettering in N/N+(100) epitaxial silicon wafers." Journal of Applied Physics 65, 2078. Published in 1989.

(Continued)

*Primary Examiner* — Khaja Ahmad
(74) *Attorney, Agent, or Firm* — Eschweiler & Associates, LLC

(57) ABSTRACT

The present disclosure relates to a silicon-on-insulator (SOI) substrate having a trap-rich layer, with crystal defects, which is disposed within a handle wafer, and an associated method of formation. In some embodiments, the SOI substrate has a handle wafer. A trap-rich layer, having a plurality of crystal defects that act to trap carriers, is disposed within the handle wafer at a position abutting a top surface of the handle wafer. An insulating layer is disposed onto the handle wafer. The insulating layer has a first side abutting the top surface of the handle wafer and an opposing second side abutting a thin layer of active silicon. By forming the trap-rich layer within the handle wafer, fabrication costs associated with depositing a trap-rich material (e.g., polysilicon) onto a handle wafer are reduced and thermal instability issues are prevented.

16 Claims, 4 Drawing Sheets

(56) References Cited

OTHER PUBLICATIONS

Saritas, et al. "Deep States Associated with Oxidation Induced Stacking Faults in RTA p-type Silicon Before and After Cooper Diffusion." Solid-State Electronics, vol. 38, No. 5, pp. 1025-1034. Published in 1995.

Ishihara, et al. "Time and Temperature Dependence of Density of Oxidation-Induced Stacking Faults in Diamond-Lapped Silicon." Japanese Journal of Applied Physics, vol. 23, No. 8, pp. L620-L622. Published in Aug. 1984.

Kuper, et al. "Density of Oxidation-Induced Stacking Faults in Damaged Silicon." Journal of Applied Physics, 60 (4). Published on Aug. 15, 1986.

Wolf, et al. "Highly Resistive Substrate CMOS on SOI for Wireless Front-End Switch Applications." CS MANTECH Conference, May 16-19, 2011, Palm Springs, California, USA.

Iacona, et al. "Roughness of Thermal Oxide Layers Grown on Ion Implanted Silicon Wafers." Journal of Vacuum Science Technology, B 16(2), Mar./Apr. 1998.

Giri, et al. "Formation and annealing of defects during high-temperature processing of ion-implanted epitaxial silicon: the role of dopant implants." Materials Science and Engineering, B71, 186-191. Published in 2000.

Neve, et al. "RF and linear performance of commercial 200 mm trap-rich HRSOI wafers for SoC applications." IEEE, SiRF. Published in 2013.

Lederer, et al. "Substrate loss mechanisms for microstrip and CPW transmission lines on lossy silicon wafers." IEEE MTT-S International Microwave Symposium Digest. IEEE MTT-S International Microwave Symposium, Nov. 2003.

Neve, et al. "Impact of Si substrate resistivity on the non-linear behaviour of RF CPW transmission lines." Proceedings of the 3rd European Microwave Integrated Circuits Conference, Oct. 2008.

\* cited by examiner

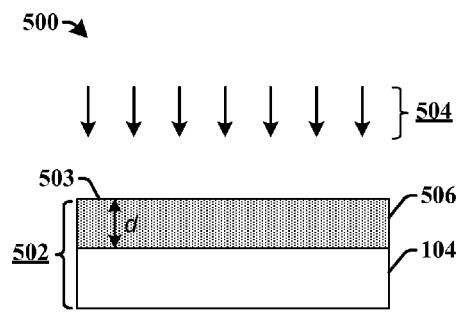
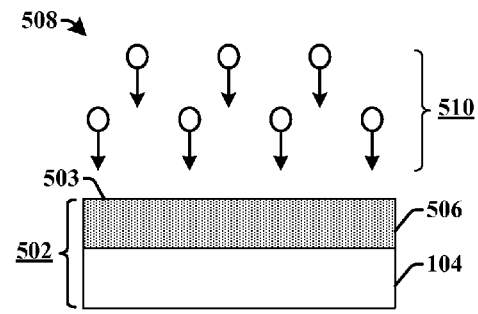
Fig. 5A    Fig. 5B
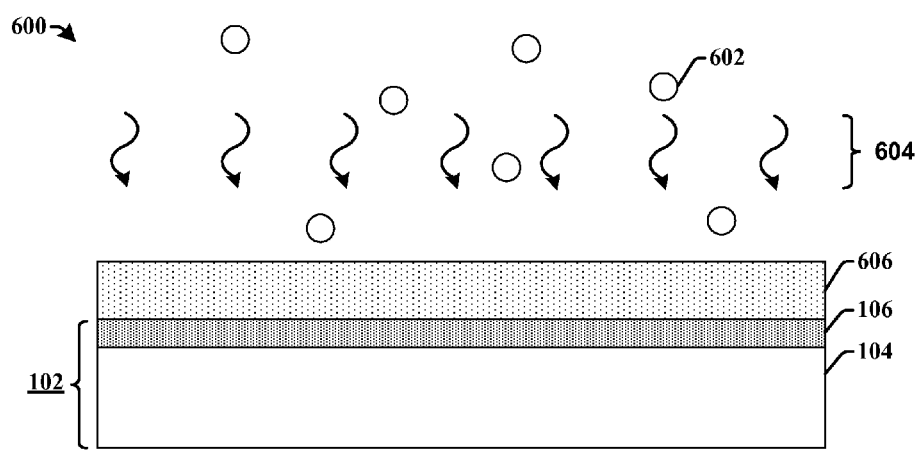
Fig. 6

HANDLE WAFER FOR HIGH RESISTIVITY TRAP-RICH SOI

BACKGROUND

Integrated chips are formed on substrates comprising a semiconductor material. Traditionally, integrated chips were formed on bulk substrates comprising a solid layer of semiconductor material. In more recent years, silicon-on-insulator substrates have emerged as an alternative. Silicon-on-insulator (SOI) substrates are substrates that have a thin layer of active silicon separated from an underlying handle wafer by a layer of insulating material. The layer of insulating material electrically isolates the thin layer of active silicon from the handle wafer, thereby reducing current leakage of devices formed within the thin layer of active silicon. The thin layer of active silicon also provides for other advantages, such as faster switching times and lower operating voltages, which have made SOI substrates widely used for high volume fabrication of radio frequency (RF) systems, such as RF switches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-8 illustrate some embodiments of cross-sectional views showing a method of forming a SOI substrate having a silicon handle wafer comprising a trap-rich layer comprising a plurality of crystal defects.

DETAILED DESCRIPTION

Figure 1:
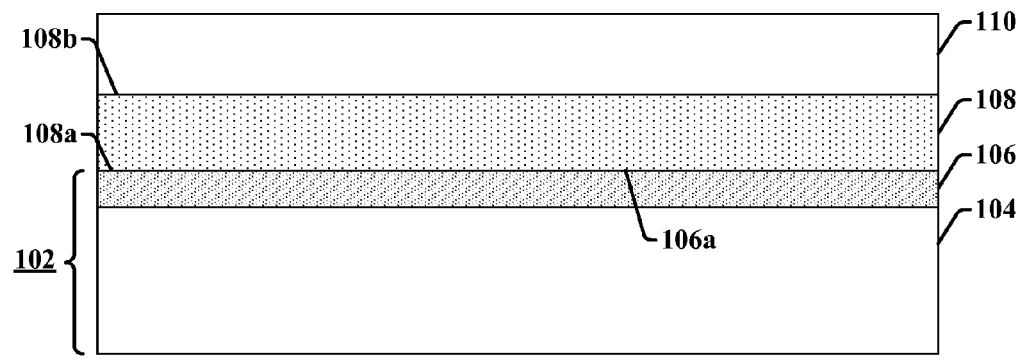
FIG. 1 illustrates a cross-sectional view of some embodiments of a silicon-on-insulator (SOI) substrate having a silicon handle wafer comprising a trap-rich layer comprising a plurality of crystal defects.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Silicon-on-insulator (SOI) substrates typically use handle wafers having a high resistivity. The use of high resistivity handle wafers allows for the SOI substrates to meet application requirements, such as device-to-device isolation, passive component Q-factors, etc. However, the doping in such high resistivity handle wafers is low, such that carriers from a handle wafer surface and sub-surface region may build up along a surface of a high resistivity handle wafer to form an accumulation or an inversion layer, depending on a type of charges present in an overlying buried oxide layer. Voltages applied to devices within an overlying thin layer of active silicon can interact with the accumulation layer resulting in parasitic surface conduction that introduces device cross-talk and/or non-linear distortions into radio frequency (RF) signals.

To prevent such non-linear distortions, SOI substrates may include a trap-rich layer configured to trap carriers, which is disposed between the handle wafer and the insulating layer. Trap-rich layers are typically formed by depositing a trap-rich material onto a handle wafer prior to bonding the handle wafer to an active silicon wafer. For example, a trap-rich layer may be formed by depositing a layer of polysilicon onto a handle wafer prior to bonding the handle wafer to an active silicon wafer. However, forming a trap-rich handle wafer in such a way is undesirable since it introduces additional cost into the fabrication process, and since it provides for a SOI substrate having thermal instability (e.g., high temperature FEOL processes may affect the polysilicon crystalline structure and its interface with the handle wafer, degrading the trapping properties of the polysilicon layer).

Accordingly, the present disclosure relates to a silicon-on-insulator (SOI) substrate having a trap-rich layer, comprising crystal defects, which is disposed within a handle wafer, and an associated method of formation. In some embodiments, the SOI substrate comprises a handle wafer. A trap-rich layer, comprising a plurality of crystal defects configured to trap carriers, is disposed within the handle wafer at a position extending from a top surface of the handle wafer to an underlying crystalline layer within the handle wafer. An insulating layer is disposed onto the handle wafer. The insulating layer has a first side abutting the top surface of the handle wafer at an interface with the trap-rich layer, and an opposing second side abutting a thin layer of active silicon. By forming the trap-rich layer within the handle wafer, fabrication costs associated with depositing a trap-rich material (e.g., polysilicon) onto a handle wafer are reduced and thermal instability issues are prevented.

FIG. 1 illustrates a cross-sectional view of some embodiments of silicon-on-insulator (SOI) substrate 100 having a trap-rich layer 106, comprising a plurality of crystal defects, which is disposed within a handle wafer 102.

The SOI substrate 100 comprises a handle wafer 102. In some embodiments, the handle wafer 102 may comprise a high resistivity silicon handle wafer (i.e., a silicon wafer having a resistivity that is greater than 1 kΩ-cm). An insulating layer 108 (e.g., a thermal oxide layer) is disposed onto the handle wafer 102. The insulating layer 108 has a first side 108a abutting a top surface 106a of the handle wafer 102 and an opposing second side 108b abutting a thin layer of active silicon 110. In some embodiments, the top surface 106a of the handle wafer 102 may be damaged in a manner that causes atoms of the handle wafer 102 to be displaced. The displaced atoms cause the top surface 106a of the handle wafer 102 to have a rough surface with protrusions extending into the overlying insulating layer 108.

The insulating layer 108 is configured to electrically isolate the thin layer of active silicon 110 from the handle wafer 102. In some embodiments, the insulating layer 108 may comprise a thermal oxide layer (e.g., silicon dioxide ($SiO_2$)). In some embodiments, the thin layer of active silicon 110 may comprise one or more semiconductor devices. For example, the thin layer of active silicon 110 may comprise passive devices and/or radio frequency (RF) switches having one or more field effect transistors.

A trap-rich layer 106 is disposed within the handle wafer 102 at a position abutting the insulating layer 108. In some embodiments, the trap-rich layer 106 extends from the top surface 106a of the handle wafer 102 to an underlying crystalline layer 104 within the handle wafer 102. The trap-rich layer 106 comprises a plurality of crystal defects. In some embodiments, the trap-rich layer 106 may comprise crystal defects comprising dislocations (i.e., areas were the atoms are out of position or misaligned within a crystal lattice) and/or oxidation induced stacking faults (OISF). The crystal defects are recombination centers configured to trap carriers (e.g., from within the insulating layer). Once trapped within the recombination centers, the lifetime of the carriers is decreased. Therefore, by trapping carriers within the crystal defects of the trap-rich layer 106 the build-up of carriers along a top surface of the handle wafer 102 is avoided, mitigating parasitic surface conduction that introduces non-linear distortions into radio frequency (RF) signals.

Figure 2:
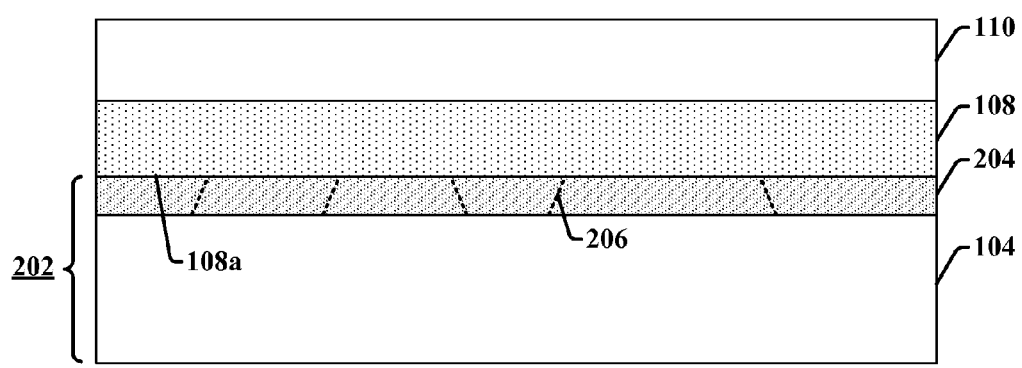
FIG. 2 illustrates a cross-sectional view of some embodiments of a SOI substrate having a silicon handle wafer comprising a trap-rich layer having crystal defects including oxide induced stacking faults and dislocations.

FIG. 2 illustrates a cross-sectional view of some embodiments of silicon-on-insulator (SOI) substrate 200 having a trap-rich layer 204, comprising crystal defects including oxidation induced stacking faults 206 and dislocations, which are disposed within a silicon handle wafer 202.

The SOI substrate 200 has a trap-rich layer 204 comprising crystal defects induced by an intentionally improper pre-oxidation anneal (e.g., a pre-oxidation anneal on an amorphous silicon region) and a subsequent oxidation. The trap-rich layer 204 is disposed between a crystalline layer 104 and an insulating layer 108. In some embodiments, the trap-rich layer 204 may comprise a remnant of a dopant species implanted into the silicon handle wafer 202 to form the amorphous material. In various embodiments, the remnant dopant species may comprise argon (Ar), carbon (C), and/or germanium (Ge).

The trap-rich layer 204 comprises oxidation induced stacking faults (OISF) 206 and dislocations. The oxidation induced stacking faults 206 and dislocations may extend into the trap-rich layer 204 from a bottom surface (i.e., first side 108a) of the insulating layer 108. In some embodiments, the oxidation induced stacking faults 206 and dislocations may extend along a (111) plane. The oxidation induced stacking faults 206 and dislocations can be detected by either delineation etch of the exposed Si surface (e.g., Wright's etch, Secco etch, Sirtle etch) or transmission electron microscopy (e.g., TEM) due to a distortion of the lattice of the re-crystallized amorphous material t.

Figure 3:
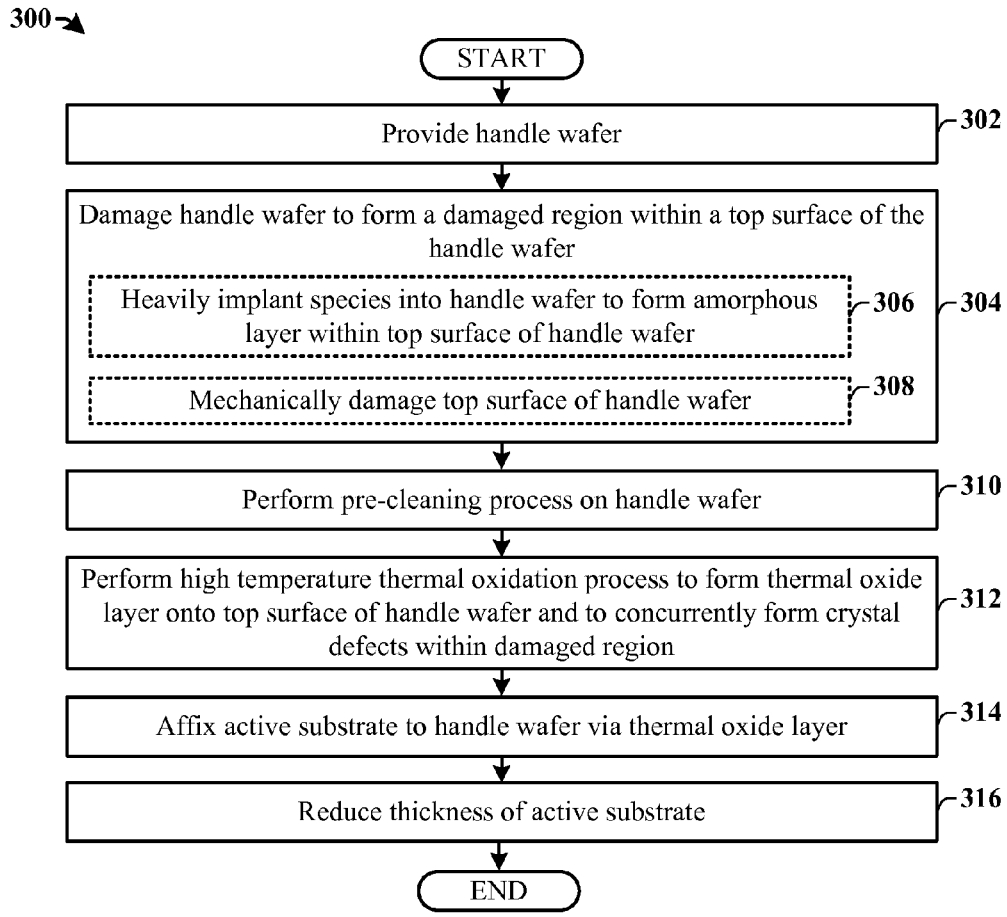
FIG. 3 illustrates a flow diagram of some embodiments of a method of forming a SOI substrate having a handle wafer comprising a trap-rich layer comprising a plurality of crystal defects.

FIG. 3 illustrates a flow diagram of some embodiments of a method 300 of forming a silicon-on-insulator (SOI) substrate having a handle wafer comprising a trap-rich layer comprising a plurality of crystal defects. The method 300 forms the trap-rich layer within the handle wafer, thereby providing for low-cost formation of SOI substrates since additional trap-rich layers are not deposited onto the handle wafer.

While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a handle wafer is provided. In some embodiments, the handle wafer may comprise a silicon handle wafer. In other embodiments, the handle wafer may comprise alternative semiconductor materials (e.g., a III-V semiconductor material, silicon carbide, silicon germanium, germanium, etc.)

At 304, the handle wafer is damaged to form an amorphous (damaged) region within a top surface of the handle wafer. Damaging the handle wafer is performed by displacing atoms from the handle wafer. In some embodiments, the handle wafer may be damaged by implanting the handle wafer with an implantation species that forms the amorphous region at a top surface of the handle wafer without introducing donors or acceptors to the handle wafer, at 306. In other embodiments, the handle wafer may be damaged by mechanically damaging the top surface of the handle wafer (e.g., micro-scratching, abrasive blasting, etc.), at 308.

At 310, a pre-cleaning process may be performed to remove contaminants from the surface of the handle wafer. In some embodiments, the pre-cleaning process may comprise a RCA clean. In some embodiments, the pre-cleaning process may introduce metal contaminants (e.g., iron atoms) to the surface of the handle wafer. The metal atoms diffuse as interstitials along oxidation induced stacking faults, thereby causing the oxidation induced stacking faults to act as recombination centers for carriers.

At 312, a high temperature thermal oxidation process is performed within a furnace having an oxidizing ambient. The high temperature thermal oxidation process is configured to form an insulating layer onto the top surface of the handle wafer. In some embodiments, the insulating layer may comprise a thermal oxide (e.g., $SiO_2$). The high temperature thermal oxidation process is further configured to concurrently form crystal defects (e.g., dislocations and/or oxidation induced stacking faults) within in the amorphous region of the handle wafer. For example, the high temperature thermal oxidation process may be performed by inserting the amorphous region into a flowing oxidizing ambient comprising oxygen (e.g., without the flow of a chlorine containing gas that suppresses crystal defects) without a proper pre-anneal to cause an amorphous layer to form oxidation induce stacking defect and/or dislocations within the re-crystallized amorphous.

At 310, an active substrate is affixed to the insulating layer.

At 312, a thickness of active substrate is reduced to form a thin layer of active abutting the insulating layer.

FIGS. 4-8 illustrate some embodiments of cross-sectional views showing a method of forming a SOI substrate having a silicon handle wafer comprising a trap-rich layer comprising crystal defects. Although FIGS. 4-8 are described in relation to method 300, it will be appreciated that the structures disclosed in FIGS. 5-12 are not limited to such a method, but instead may stand alone as structures independent of the method.

Figure 4:

FIG. 4 illustrates a cross-sectional view 400 of some embodiments corresponding to act 302.

As shown in cross-sectional view 400, a handle wafer 402 is provided. In some embodiments, the handle wafer 402 may comprise a high resistivity silicon wafer. In such embodiments, the high resistivity silicon wafer comprises a resistivity that is greater than or equal to 1 kΩ-cm. In some embodiments, the handle wafer 402 may comprise a high resistivity silicon wafer having a (100) crystal orientation. In other embodiments, the handle wafer 402 may comprise a high resistivity silicon wafer having a different crystal orientation (e.g., a (111) crystal orientation).

FIGS. 5A-5B illustrate cross-sectional views, 500 and 508, of some embodiments corresponding to act 304.

FIG. 5A illustrates a cross-sectional view 500 of the handle wafer 502 being damaged by an implantation process. The implantation process is performed by introducing an implantation species 504 into a top surface 503 of the handle wafer 502. The implantation species 504 displaces atoms within the handle wafer 102 to form an amorphous region 506 comprising an amorphous layer (i.e., a layer having crystal defects that provide for a lattice without a long-term periodic crystalline structure) disposed along the top surface 503 of the handle wafer 502 at a position overlying a crystalline layer 104. The amorphous region 506 vertically extends from the top surface 503 of the handle wafer 102 to a depth d within the handle wafer 502. It will be appreciated that the depth d of the amorphous region 506 may be changed by adjusting one or more parameters of the implantation process (e.g., by changing an energy of the implantation process).

The implantation species 504 may comprise an electrically neutral species that does not introduce donors or acceptors into the handle wafer 102. For example, in some embodiments, the implantation species 504 may comprise argon (Ar), silicon (Si), carbon (C), and/or germanium (Ge). In some embodiments, the implantation process may be performed using a dose that is greater than or equal to approximately $1e15/cm^2$ and at energies in a range of between approximately 1 kV and approximately 1 Mv.

FIG. 5B illustrates a cross-sectional view 508 of the handle wafer 502 being damaged by a mechanical process. As shown in cross-sectional view 508, mechanical damage is induced upon a top surface 503 of the handle wafer 502 by forcibly propelling a plurality of abrasive particles 510 (e.g., sand, rough polishing slurry) against a top surface of the handle wafer 502. Upon colliding with the handle wafer 502, the abrasive particles 510 displace atoms within the handle wafer 502 to form an amorphous region 506 disposed above a crystalline layer 104.

It will be appreciated that although FIG. 5B illustrates mechanical damage as an abrasive blasting process that mechanical damage is not limited to such processes. For example, in some embodiments, the mechanical damage may be induced upon the handle wafer 502 by micro-scratching the handle wafer 502 to form micro-scratches within the top surface 503 of the handle wafer 502. For example, in some embodiments, the top surface 503 of the handle wafer 502 may be scratch with an abrasive particle (e.g., diamond) having a size of between 1 and 10 um.

FIG. 6 illustrates a cross-sectional view 600 of some embodiments corresponding to act 312.

As shown in cross-sectional view 600, a high temperature thermal oxidation process is performed within a furnace having a flowing oxidizing ambient comprising oxidizing particles 602. The flowing oxidizing ambient is free of agents that can suppress formation of the oxidation induced stacking faults (e.g., chlorine containing gases such as hydrochloric acid (HCl), TCA, etc.). Performing the high temperature thermal oxidation process comprises exposing the handle wafer 102 to a high temperature 604 in the presence of the oxidizing ambient, and results in the formation of a thermal oxide layer 606 along a top surface of the handle wafer 102. Because the high temperature thermal oxidation process is performed by providing oxygen atoms to an interface between the thermal oxide layer 606 and the handle wafer 102, the thermal oxide layer 606 consumes a portion of the handle wafer 102 comprising the amorphous region 506.

The high temperature thermal oxidation process concurrently forms crystal defects within the amorphous region 506 of handle wafer 102. For example, in some embodiments the high temperature thermal oxidation process causes the amorphous region 506 to be re-crystallized, wherein the re-crystallized silicon comprises oxidation induced stacking faults and/or dislocations. In such embodiments, the oxidation induced stacking faults and/or dislocations extend outward from the thermal oxide layer 606. The formation of crystal defects within the amorphous region 506 causes the amorphous region 506 to form a trap-rich layer 106 positioned between the thermal oxide layer and an underlying crystalline silicon layer. The trap rich layer 106 comprises crystal defects that act as recombination centers that trap carriers.

In some embodiments, the high temperature thermal oxidation process may be performed in a furnace having a dry $O_2$ ambient or a wet $H_2O$ ambient. In some embodiments, the high temperature thermal oxidation process may be performed by providing the damaged handle wafer into a furnace held at a temperature greater than 550° C. and comprising a flowing oxidizing ambient (e.g., a flowing $O_2$ gas or $H_2O$ steam). The high temperature flowing oxidizing ambient allows for the thermal oxide layer 606 to be grown without allowing for epitaxial re-growth of amorphous material.

Figure 7:
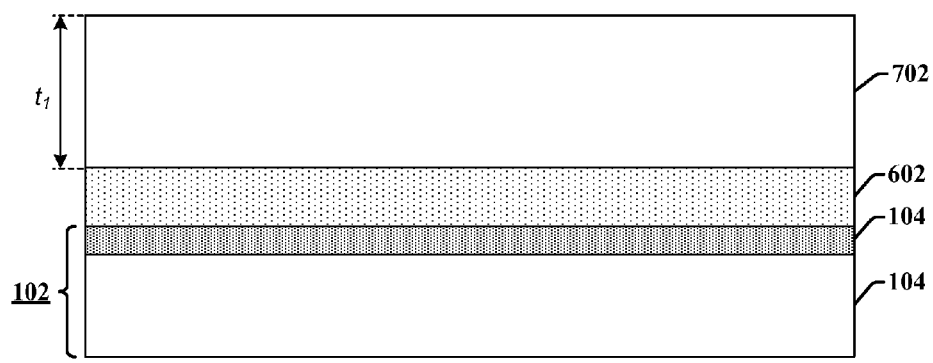

FIG. 7 illustrates a cross-sectional view 700 of some embodiments corresponding to act 314.

As shown in cross-sectional view 700, an active silicon substrate 702 is bonded to the handle wafer 102. Upon being bonded to the handle wafer 102, the active silicon substrate 702 has a thickness of $t_1$. In some embodiments, a direct bonding process may be used to bond the active silicon substrate 702 to the handle wafer 102 by way of the thermal oxide layer 606.

Figure 8:
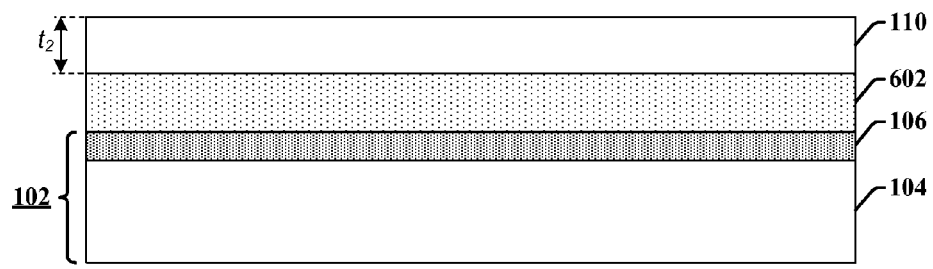

FIG. 8 illustrates a cross-sectional view 800 of some embodiments corresponding to act 316.

As shown in cross-sectional view 800, a thickness of the active silicon substrate 702 is reduced. Reducing the thickness of the active silicon substrate forms a thin layer of active silicon 110 (having a thickness $t_2 < t_1$) abutting the thermal oxide layer 606. In some embodiments, the thickness of the active silicon substrate 702 may be reduced by performing an implantation process to implant hydrogen into the active silicon substrate 702 along a horizontal cleaving plane that is parallel to the top surface of the active silicon substrate 702. The implantation of hydrogen results in the formation of hydrogen molecules ($H_2$) and H+ ions along the cleaving plane, which weaken bonds between silicon atoms. A force is then applied to cleave the active silicon substrate 702 along the cleaving plane, resulting in the thin layer of active silicon 110. In other embodiments, the thickness of the active silicon substrate 702 may be reduced by an etching process, for example.

Therefore, the present disclosure relates to a silicon-on-insulator (SOI) substrate having a trap-rich layer, comprising crystal defects, which is disposed within a handle wafer, and an associated method of formation.

In some embodiments, the present disclosure relates to a substrate. The substrate comprises a handle wafer. The substrate further comprises a trap-rich layer disposed within the handle wafer at a position extending from a top surface of the handle wafer to an underlying crystalline layer within the handle wafer, wherein the trap rich layer comprises a plurality of crystal defects configured to trap carriers. The substrate further comprises an insulating layer having a first side abutting the top surface of the handle wafer at an interface with the trap-rich layer, and a thin layer of active silicon abutting a second side of the insulating layer that opposes the first side.

In other embodiments, the present disclosure relates to a silicon-on-insulator (SOI) substrate. The SOI substrate comprises a high resistivity silicon handle wafer. The SOI substrate further comprises a trap-rich layer disposed within the handle wafer at a position abutting a top surface of the handle wafer, wherein the trap rich layer comprises a plurality of crystal defects configured to trap carriers. The SOI substrate further comprises a thermal oxide layer having a first side abutting the top surface of the handle wafer at an interface with the trap-rich layer, and a thin layer of active silicon abutting a second side of the insulating layer that opposes the first side.

In yet other embodiments, the present disclosure relates to a method of forming a silicon-on-insulator (SOI) substrate. The method comprises damaging a top surface of a high resistivity handle wafer to form an amorphous region along the top surface. The method further comprises performing a high-temperature oxidation process to concurrently form a thermal oxide layer onto the amorphous region and to form a plurality of crystal defects within the amorphous region that are configured to trap carriers. The method further comprises affixing an active silicon wafer to the thermal oxide layer, and reducing a thickness of the active silicon wafer to form a thin layer of active silicon abutting the thermal oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A substrate, comprising:
    a handle wafer;
    a trap-rich layer disposed within the handle wafer at a position abutting a top surface of the handle wafer, wherein the trap rich layer comprises a re-crystallized material having a plurality of oxidation induced stacking faults configured to trap carriers;
    an insulating layer having a first side abutting the top surface of the handle wafer at an interface with the trap-rich layer, wherein the top surface of the handle wafer has a scratched top surface with depressions extending in lines across the top surface of the handle wafer and forming protrusions extending into the insulating layer; and
    a thin layer of active silicon abutting a second side of the insulating layer that opposes the first side.

2. The substrate of claim 1, wherein the re-crystallized material comprises re-crystallized amorphous silicon.

3. The substrate of claim 1, wherein the insulating layer comprises a thermal oxide layer.

4. The substrate of claim 2, wherein the re-crystallized amorphous silicon comprises a remnant of a dopant species implanted into the handle wafer to form the re-crystallized amorphous silicon.

5. The substrate of claim 4, wherein the remnant of the dopant species comprises argon (Ar), silicon (Si), carbon (C), or germanium (Ge).

6. The substrate of claim 1, wherein the thin layer of active silicon comprises an RF switch having one or more field effect transistors.

7. A silicon-on-insulator (SOI) substrate, comprising:
    a high resistivity silicon handle wafer having a scratched top surface with depressions extending in lines across the scratched top surface of the high resistivity silicon handle wafer;
    a trap-rich layer, comprising a re-crystallized amorphous silicon material, which is disposed within the handle wafer at a position extending from the scratched top surface of the handle wafer to an underlying crystalline layer within the handle wafer, wherein the trap rich layer comprises dislocations or oxidation induced stacking faults configured to trap carriers;
    a thermal oxide layer having a first side abutting the scratched top surface of the handle wafer at an interface with the trap-rich layer; and
    a thin layer of active silicon abutting a second side of the thermal oxide layer that opposes the first side.

8. The SOI substrate of claim 7, wherein the re-crystallized amorphous silicon material comprises a remnant of a dopant species implanted into the handle wafer to form the amorphous silicon material.

9. The SOI substrate of claim 8, wherein the remnant of the dopant species comprises argon (Ar), silicon (Si), carbon (C), or germanium (Ge).

10. The SOI substrate of claim 7, wherein the scratched top surface of the high resistivity silicon handle wafer has protrusions extending into the thermal oxide layer.

11. A silicon-on-insulator (SOI) substrate, comprising:
    a high-resistivity silicon handle substrate;
    a trap-rich layer comprising re-crystallized amorphous silicon having oxidation induced stacking faults extending from a top surface of the high-resistivity silicon handle substrate to an underlying crystalline layer within the high-resistivity silicon handle substrate;
    an oxide layer having a first side abutting the top surface of the high-resistivity silicon handle substrate at an interface with the trap-rich layer, wherein the top surface of the high-resistivity silicon handle substrate is a scratched top surface with depressions extending in lines across the top surface of the substrate and forming protrusions extending into the oxide layer; and
    a thin layer of active silicon abutting a second side of the oxide layer that opposes the first side.

12. The SOI substrate of claim 11, wherein the re-crystallized amorphous silicon comprises a remnant of a dopant species.

13. The SOI substrate of claim 12, wherein the remnant of the dopant species comprises argon (Ar), silicon (Si), carbon (C), or germanium (Ge).

14. The SOI substrate of claim 12, wherein the remnant of the dopant species comprises two or more of argon (Ar), silicon (Si), carbon (C), and germanium (Ge).

15. The substrate of claim 11, wherein the thin layer of active silicon comprises an RF switch having one or more field effect transistors.

16. The substrate of claim 11, wherein the silicon handle substrate has a resistivity that is greater than 1 kΩ-cm.

* * * * *